United States Patent [19]

Van Voorhis

[11] 4,044,347
[45] Aug. 23, 1977

[54] VARIABLE-LENGTH TO FIXED-LENGTH CONVERSION OF MINIMUM-REDUNDANCY CODES

[75] Inventor: David Curtis Van Voorhis, Los Gatos, Calif.

[73] Assignee: International Business Machines Corporation, Armonk, N.Y.

[21] Appl. No.: 578,959

[22] Filed: May 19, 1975

[51] Int. Cl.² .......................................... H03K 13/24
[52] U.S. Cl. .............................. 340/347 DD; 364/900
[58] Field of Search ................ 235/154; 340/347 DD, 340/172.5; 178/DIG. 3

[56] References Cited

U.S. PATENT DOCUMENTS

| | | | |
|---|---|---|---|
| 3,560,639 | 2/1971 | Centanni | 358/261 |
| 3,675,211 | 7/1972 | Raviv | 340/172.5 |
| 3,675,212 | 7/1972 | Raviv et al. | 340/172.5 |
| 3,701,111 | 10/1972 | Cocke et al. | 340/172.5 |
| 3,835,467 | 9/1974 | Woodrum | 340/347 DD |

OTHER PUBLICATIONS

Yan-Yuen Tao, "A Firmware Compression Unit," 1/74 Dept. of Computer Science, University of Illinois pp. 1–54.

Primary Examiner—Thomas J. Sloyan
Attorney, Agent, or Firm—Otto Schmid, Jr.

[57] ABSTRACT

Apparatus for converting the codewords of variable-length minimum-redundancy codes into corresponding fixed-length characters. The conversion process employs a two-step mapping wherein a codeword is first converted into a fixed-length integer, and then the integer is used to index a table of fixed-length characters. The apparatus for achieving this two-step mapping comprises table storage, summation circuitry, compare/combine circuitry, and control circuitry. The table storage holds two tables, a first table containing the fixed-length characters and a second table whose values uniquely identify the variable-length code. The compare/combine circuitry and the summation circuitry accept as input the successive bits of a codeword to be converted into its corresponding fixed-length character. As the successive codeword bits are received, the summation circuitry operates on elements of the second table to calculate successive values of a weighted sum and an unweighted sum. The compare/combine circuitry uses the successive values of the weighted sum to isolate the bits comprising the codeword. This codeword is then combined with the weighted sum and the unweighted sum to provide a fixed-length integer, and the integer is used to index the table of fixed-length characters.

13 Claims, 6 Drawing Figures

VARIABLE-LENGTH TO FIXED-LENGTH CONVERSION OF MINIMUM-REDUNDANCY CODES

BACKGROUND OF THE INVENTION

Variable-length coding can be used for data compaction of a data base comprising fixed-length characters, such as the 8-bit EBCDIC characters commonly employed for alphanumeric letters, numerals, and symbols. The lengths of the various codewords in the variable-length code are chosen so that the shorter codewords are used to represent the more frequently occurring characters and the longer codewords are used to represent the less frequently occurring characters. Thus the average length of codewords in the variable-length code is less than the fixed length of the characters.

The use of variable-length codes for data compaction of a data base comprising fixed-length characters requires a facility for converting between fixed-length characters and their corresponding codewords. The conversion of fixed-length characters into codewords is commonly termed "encoding," while the inverse conversion is commonly called "decoding." The decoding process is normally more difficult than the encoding process, since a sequence of codewords to be decoded comprises a string of binary digits. This string of digits must be partitioned into the different codewords before the codewords can be identified and converted.

The primary disadvantage of previous decoders for variable-length codes is that they have represented a compromise among three coding objectives. The first objective is an ability to decode a variable-length code whose average codeword length is as small as possible when the code is used for a given data base. Such a code permits the greatest possible data compaction for the data base. The second coding objective is an ability to decode codewords quickly and economically. The third objective is an ability to decode a variety of different variable-length codes, with each code designed to provide data compaction for a different data base.

For any given data base, the well-known Huffman algorithm can be used to construct a minimum-redundancy code, i.e., a variable-length code with the minimum average codeword length possible for that data base. Three general types of decoders are currently in use for Huffman codes, namely the table-lookup types, the tree-follower types, and the encoder-based types. However, these decoders have proved to be expensive, time-consuming, or incapable of decoding more than a single code.

A table-lookup decoder includes a table containing each codeword as a separate entity. As the successive codeword bits of a codeword are received, each codeword in the table must be checked to see whether it agrees with all codeword bits received so far. When only one codeword agrees, that codeword has been received and identified. The table storge required by this table-lookup type of decoder requires an expensive associative memory.

A tree-follower decoder depends upon the fact that Huffman codes have a tree-like structure. The decoder includes logic circuitry corresponding to the tree, and the reception of successive bits of a codeword causes control circuitry to traverse this tree-like structure. When a terminal node of the tree is reached, an entire codeword has been received, and the terminal node identifies the codeword. This tree-follower type of decoder is either expensive, if duplicate circuitry is provided for each node of the tree, or slow, if the same circuitry must be used again and again to represent different nodes of the tree.

An encoder-based decoder includes a copy of the encoder, a character generator, and comparison circuitry. The character generator supplies successive fixed-length characters to the encoder, and the encoder produces the codeword appropriate for each successive character. Each codeword thus produced is compared with the bits of the codeword to be decoded. When a match occurs, the codeword to be decoded is known to represent the last character supplied to the encoder. This encoder-based type of decoder is quite slow, since it may need to generate and test many codewords.

As has been described, previous decoders for Huffman codes have proved to be expensive, time-consuming, or incapable of decoding more than a single code. Therefore, a number of special variable-length codes have been developed that admit fast and inexpensive decoders. For example, reference may be made to Cocke et al., U.S. Pat. No. 3,701,111, "Method and Apparatus for Decoding Variable-Length Codes Having Length-Indicating Prefixes," and Raviv, U.S. Pat. No. 3,675,211, "Data Compaction Using Modified Variable-Length Coding." However, these special codes are not minimally redundant. That is, their average codeword lengths exceed the average codeword lengths of Huffman codes.

SUMMARY OF THE INVENTION

It is therefore an object of this invention to provide an apparatus for quickly and economically decoding the codewords of a variety of variable-length minimum-redundancy codes.

The above and other objects are accomplished in accordance with the invention by employing a two-step mapping, wherein codewords from a specially-designed Huffman-equivalent code are first converted into fixed-length integers, and then these integers are used to access a table of fixed-length characters. The decoding apparatus comprises table storage, summation circuitry, compare/combine circuitry, and control circuitry.

The table storage for the decoding apparatus holds an F table, whose values comprise the fixed-length characters of a given data base, and an S table, whose values identify the corresponding variable-length minimum-redundancy code to be decoded. The fixed-length characters are arranged in order of increasing frequency of occurrence in the data base, so that $f(0)$ is the most frequently occurring character, $f(1)$ is the second most frequently occurring character, and so on. The elements of the S table are based on the lengths of the codewords in the variable-length code to be decoded. In particular, the $k^{th}$ table value $s(k)$ is the number of codewords that are exactly $k$ bits long.

The compare/combine circuitry accepts as input the successive bits $y_1, y_2, \ldots,$ of a codeword $c_V(i)$ to be decoded. As the successive codeword bits are received, the summation circuitry operates on elements of the S table to calculate successive values $t(k)$ of a weighted sum and successive values $b(k)$ of an unweighted sum. These values are calculated according to the formulas $$t(k) = \sum_{j=1}^{k} 2^{k-j} s(j);$$

-continued
$$b(k) = \sum_{j=1}^{k} s(j).$$

The compare/combine circuitry concatenates the codeword bits received to form successive integers $y(k) = y_1y_2 \ldots y_k$ for comparison with $t(k)$.

If it is found that $y(k) \geq t(k)$, then $y(k)$ is known to be the first $k$ bits of a codeword $c_V(i)$ whose length exceeds $k$ bits. Thus another codeword bit is input, and the next values of the weighted sum and the unweighted sum are calculated. Alternatively, if it is found that $y(k) < t(k)$, then $y(k)$ is known to be the $k$-bit codeword $c_V(i)$ to be decoded. The compare/combine circuitry thus combines this codeword with the weighted sum $t(k)$ and the unweighted sum $b(k)$ to calculate the codeword index $i$ according to the formula $$i = y(k) - t(k) + b(k).$$

Finally, the index $i$ is used to access the corresponding fixed-length character, which is the table element $f(i)$.

DESCRIPTION OF THE PREFERRED EMBODIMENT

STRUCTURE OF THE DECODING APPARATUS

Figure 1:
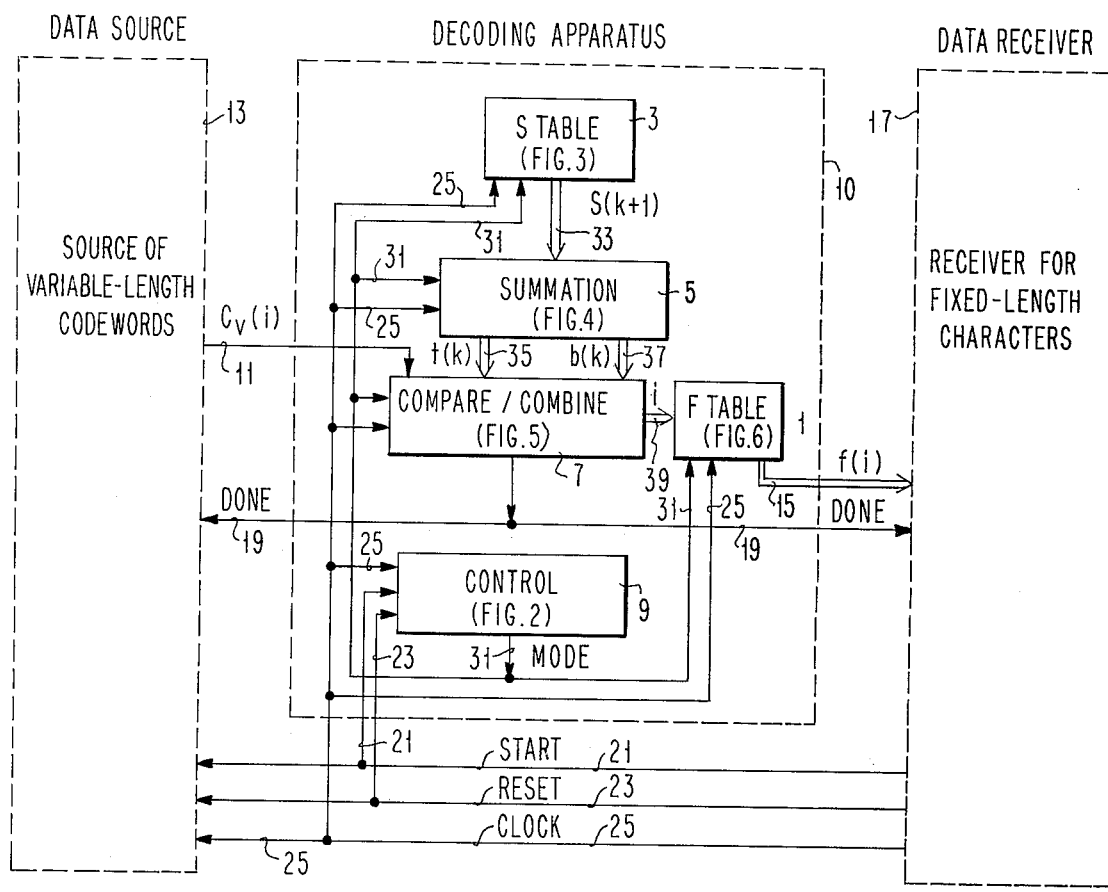
FIG. 1 is a block schematic diagram of a decoding apparatus in accordance with the present invention.

Referring now to FIG. 1, there is shown the structure of the apparatus for decoding the codewords of a variable-length minimum-redundancy code into fixed-length characters. The decoding apparatus comprises an F table 1, an S table 3, summation circuitry 5, compare/combine circuitry 7, and control circuitry 9. The successive bits of a codeword $c_V(i)$ to be decoded are input serially on line 11 from a data source 13. The decoding apparatus performs a two-step mapping wherein the bits comprising codeword $c_V(i)$ are first isolated and converted into the fixed-length integer $i$, and then the integer $i$ is used to access the corresponding fixed-length character $f(i)$ from the F table 1. This fixed-length character is supplied via lines 15 to data receiver 17. The successful decoding of the variable-length codeword is indicated by a signal on line 19, and this signal is supplied to both the data source 13 and the data receiver 17.

As will be explained, the structure of the decoding apparatus 10 shown in FIG. 1 can be adapted for decoding a minimum-redundancy code for any set of fixed-length characters. However, as a practical matter, the physical size of the various circuit components and data paths for any particular embodiment of the decoding apparatus will limit the use of that embodiment to fixed-length characters at most $L_F$ bits long and codewords at most $L_V$ bits long. Here $L_F$ and $L_V$ are chosen design parameters. The preferred embodiment of the decoding apparatus shown in FIGS. 2-6 is based on a maximum length $L_V = 4$ for fixed-length characters and a maximum length $L_V = 7$ for codewords in a variable-length code.

The apparatus shown in FIG. 1 has been designed for converting a sequence of codewords supplied by the data source 13 into the corresponding sequence of fixed-length characters transmitted to the data receiver 17. Since a variable number of codeword bits inputted via line 11 are converted into fixed-length characters outputted on lines 15, a variable data rate must be supported by either the data source 13 or the data receiver 17. The decoding apparatus 10 shown in FIG. 1 can be adapted for a variable data rate on either or both of lines 11 and 15. However, since systems that deal with fixed-length characters often require a fixed data rate, the preferred embodiment of the decoding apparatus shown in FIGS. 2-6 supports a variable input rate on line 11 and a fixed output rate on lines 15.

A decoding operation is initiated by a START signal on line 21 in conjunction with a clock pulse on line 25. The START signal and clock pulse are supplied by the data receiver 17 to the decoding apparatus 10 and the data source 13. Then, successive clock pulses supplied by the data receiver 17 on line 25 cause the data source 13 to provide successive codewords serially over line 11 to the decoding apparatus 10. The successive clock pulses on line 25 also cause the decoding apparatus 10 to decode the codewords supplied thereto on line 11 and to provide the corresponding fixed-length characters on lines 15. The internal timings of the data source 13 and the decoding apparatus 10 are adjusted so that for every $L_V + 1 = 8$ clock pulses on line 25, exactly one codeword is supplied serially via line 11 to the decoding apparatus 10, and its corresponding fixed-length character is provided via lines 15. Here $L_V = 7$ is the length of the longest possible codeword. Thus a fixed data rate is provided over lines 15.

The decoding operation is terminated by a RESET signal on line 23 in conjunction with a clock pulse on line 25. This RESET signal and clock pulse are supplied by the data receiver 17 to the decoding apparatus 10 and the data source 13.

Before describing in detail the operation of the decoding apparatus 10 shown in FIG. 1, it will be instructive to consider a sample data base of fixed-length characters and the corresponding variable-length minimum-redundancy code to be decoded.

Constructing and Decoding Minimum-Redundancy Codes

Table 1 summarizes the distribution of BCD characters in a sample data base and shows the Huffman code for the data base. The leftmost columns of Table 1 shows the sixteen 4-bit BCD characters and their relative frequencies of occurrence in the data base. The rightmost two columns of Table 1 show the Huffman codewords and the lengths of these codewords. For example, the 8th BCD character is $C_F(8) = 1000$, and the relative frequency of occurrence for this character in the data base is $P(C_F(8)) = 1/32$. The Huffman codeword for $C_F(8)$ is $C_H(8) = 10101$, and this codeword is $1_H(8) = 5$ bits long.

The Huffman codewords are calculated according to the procedure described by D. A. Huffman in the article, "A Method for the Construction of Minimum-Redundancy Codes," (*Proceedings of the IRE*, Volume 51, September, 1952, pp. 1098-1101). Note that whereas each fixed-length BCD character requires 4 bits, the average length of the Huffman codewords is $$\sum_{i=0}^{15} P(C_F(i))l_H(i) = 3.45 \text{ bits}.$$

Thus the storage requirement of the data base can be reduced by a factor of 3.45/4 = 0.86 by using the Huffman codewords in place of the BCD characters.

Table 1.

Sample Huffman Code for 4-bit BCD Characters

| i | $C_F(i)$ | $P(C_F(i))$ | $C_H(i)$ | $l_H(i)$ |
|---|---|---|---|---|
| 0 | 0000 | 1/4 | 00 | 2 |
| 1 | 0001 | 1/16 | 0100 | 4 |
| 2 | 0010 | 1/16 | 0101 | 4 |
| 3 | 0011 | 1/8 | 011 | 3 |
| 4 | 0100 | 1/16 | 1000 | 4 |
| 5 | 0101 | 1/64 | 101000 | 6 |
| 6 | 0110 | 1/16 | 1001 | 4 |
| 7 | 0111 | 1/64 | 101001 | 6 |
| 8 | 1000 | 1/32 | 10101 | 5 |
| 9 | 1001 | 1/16 | 1011 | 4 |
| 10 | 1010 | 1/16 | 1100 | 4 |
| 11 | 1011 | 1/32 | 11010 | 5 |
| 12 | 1100 | 1/128 | 1101100 | 7 |
| 13 | 1101 | 1/128 | 1101101 | 7 |
| 14 | 1110 | 1/64 | 110111 | 6 |
| 15 | 1111 | 1/8 | 111 | 3 |

Table 2 shows an alternative variable-length code that can be used in place of the Huffman code for the data base of BCD characters. This alternative code is constructed in three steps as follows. First, arrange the BCD characters in order of increasing frequency of occurrence, so that $f(i)$ is the $i^{th}$ most frequently occurring character. Second, let $l_V(i)$ be the length of the Huffman codeword for the BCD character $f(i)$. Third, let the codeword $c_V(i)$ be the $l_V(i)$-bit binary integer with value $$\sum_{j=0}^{i-1} 2^{l_V(i) - l_V(j)}$$

As an example, consider the case $i = 9$. As indicated in Table 2, the 9th most frequently occurring BCD character is $f(9) = 1000$, and this character occurs with relative frequency $p(f(9)) = 1/32$. Checking with Table 1, we find that the Huffman code uses the 5-bit codeword $C_H(8) = 10101$ for the BCD character $f(9) = 1000$; therefore, we assign $l_V(9) = 5$. Finally, to determine the codeword $c_V(9)$ we calculate the sum $$\sum_{j=0}^{8} 2^{l_V(9) - l_V(j)} = \sum_{j=0}^{8} 2^{5 - l_V(j)} = 28.$$

Thus $c_V(9) = 11100$, which is the binary representation for the decimal integer 28.

Table 2.

An Alternative Code for the BCD Characters

| i | f(i) | P(f(i)) | $l_V(i)$ | $c_V(i)$ |
|---|---|---|---|---|
| 0 | 0000 | 1/4 | 2 | 00 |
| 1 | 0011 | 1/8 | 3 | 010 |
| 2 | 1111 | 1/8 | 3 | 011 |
| 3 | 0001 | 1/16 | 4 | 1000 |
| 4 | 0010 | 1/16 | 4 | 1001 |
| 5 | 0100 | 1/16 | 4 | 1010 |
| 6 | 0110 | 1/16 | 4 | 1011 |
| 7 | 1001 | 1/16 | 4 | 1100 |
| 8 | 1010 | 1/16 | 4 | 1101 |
| 9 | 1000 | 1/32 | 5 | 11100 |
| 10 | 1011 | 1/32 | 5 | 11101 |
| 11 | 0101 | 1/64 | 6 | 111100 |
| 12 | 0111 | 1/64 | 6 | 111101 |
| 13 | 1110 | 1/64 | 6 | 111110 |
| 14 | 1100 | 1/128 | 7 | 1111110 |
| 15 | 1101 | 1/128 | 7 | 1111111 |

The construction of the variable-length code in Table 2 guarantees that the code is minimally redundant. That is, its average codeword length is precisely equal to the average codeword length for the Huffman code, namely $$\sum_{i=0}^{15} P(f(i))l_V(i) = 3.45 \text{ bits}.$$

Therefore, the variable-length code in Table 2 can be used in place of the Huffman code in Table 1 to reduce the storage requirement of the data base by a factor of 3.45/4 = 0.86. Furthermore, the following two characteristics of the variable-length code in Table 2 make it easier to decode than the Huffman code.

1. All codewords with the same length are successive binary integers. More precisely, if $l_V(i) = l_V(j)$, then $c_V(i) = c_V(j) - j + i$.
2. The binary value of the $k$-bit prefixes of codewords longer than $k$ bits exceed the binary values of all $k$-bit codewords. More precisely, if $l_V(i) > l_V(j)$, then the first $l_V(j)$ bits of the codeword $c_V(i)$ constitute a binary integer larger than $c_V(j)$.

These two features of the variable-length code in Table 2 allow it to be characterized by $2L_V = 14$ binary integers $b(1), b(2), \ldots, b(L_V)$ and $t(2), \ldots, t(L_V)$, where $L_V = 7$ is the length of the longest codeword. The $2L_V$ integers are defined by the relations, $b(k) = $ number of codewords with $k$ or fewer bits;

$t(k) = $ is a prefix whose binary value equals the highest valued $k$-bit codeword plus 1, and also is the smallest $k$-bit binary value among the prefixes of all codewords which are more than $k$ bits long, for $k < L_V$, while $t(L_V) = 2^{L_V}$.

With these definitions, these two features of the variable-length code in Table 2 follow:

1. If $l_V(i) = k$, then the $k$-bit codeword $c_V(i)$ satisfies the formula $c_V(i) = t(k) - (b(k) - i)$.
2. If $l_V(i) > k$, then the first $k$ bits of the codeword $c_V(i)$ constitute a binary integer at least as large as $t(k)$.

A decoder can use the quantities $b(0), b(1), \ldots, b(L_V)$ and $t(1), t(2), \ldots, t(L_V)$ as follows to isolate and identify codewords from the variable-length code in Table 2. As the successive bits $y_1, Y_2, \ldots$ of a codeword $c_V(i)$ are received, they are concatenated to form successive integers $y(1), y(2), \ldots$, where $$y(k) = Y_1 Y_2 \ldots Y_k.$$

The successive values $y(k)$ are compared with the successive quantities $t(k)$. If $Y(k) \geq t(k)$, then the integer $Y(k)$ comprising the first k codeword bits received is a $k$-bit prefix for a codeword more than $k$ bits long. In this case, additional codeword bits must be processed. However, if $y(k) < t(k)$, then $y(k)$ is a $k$-bit codeword $c_V(i)$. The index $i$ for this codeword can be determined by substituting $Y(k)$ for $c_V(i)$ in the formula $c_V(i) = t(k) - $ $b(k) + i$ and solving for $i$ to achieve $i = Y(k) - t(k) + b(k)$.

As an example of this decoding process, consider its operation for the codeword $c_V(9) = 11100$ appearing in Table 2. Table 3 shows the binary integers $b(1), b(2), \ldots, b(L_V)$ and $t(1), t(2), \ldots, t(L_V)$, with $L_V = 7$, that characterize the variable-length code in Table 2. When the first bit $Y_1 = 1$ of the codeword $c_V(9) = 11100$ is received, the integer $Y(1) = Y_1 = 1$ is compared with the quantity $t(1) = 0$. Since $y(1) \geq t(1)$, $y(1)$ is known to be the first bit of a codeword more than one bit long. Thus an additional codeword bit $y_2 =$ is input, and the integer $y(2) = Y_1Y_2 = 11$ is compared with $t(2) = 01$. Since $Y(2) \geq t(2)$, $Y(2)$ is known to be the first two bits of a codeword more than two bits long. Thus a third codeword bit must be input. Similarly, since $y(3) = y_1Y_2Y_3 = 111 \geq t(3) = 100$, a fourth codeword bit must be input, and since $Y(4) = Y_1Y_2Y_3Y_4 = 1110 \geq t(4) = 1110$, a fifth codeword bit must be input. However, since $Y(5) = Y_1Y_2Y_3Y_4Y_5 = 11100 < 11110$, $Y(5)$ is known to be a 5-bit codeword $c_V(i)$. The index i for this codeword is determined by the formula $i = Y(5) - t(5) + b(5) = 11100 - 11110 + 1011 = 1001$. Thus $i$ has the binary value 1001, and the decimal value 9, so that $Y(5) = 11100$ has been correctly identified as the codeword $c_V(9)$.

Table 3.

| | Binary Values that Characterize the Sample Variable-Length Code | | |
|---|---|---|---|
| k | b(k) | t(k) | s(k) |
| 1 | 00000 | 00000000 | 000 |
| 2 | 00001 | 00000001 | 001 |
| 3 | 00011 | 00000100 | 010 |
| 4 | 01001 | 00001110 | 110 |
| 5 | 01011 | 00011110 | 010 |
| 6 | 01110 | 00111111 | 011 |
| 7 | 10000 | 10000000 | 010 |

A decoder that stores the values $b(1), b(2), \ldots, b(L_V)$ and $t(1), t(2), \ldots, t(L_V)$ shown in Table 3 can use the procedure described above to isolate and identify codewords from the variable-length code in Table 2. Alternatively, a decoder can store the quantities $s(1), s(2), \ldots, s(L_V)$ defined by the relations $s(k)$ = number of k-bit codewords.

This results in a list of compressed pointers. These quantities can then be used to calculate the required values $b(1), b(2), \ldots, b(L_V)$ and $t(1), t(2), \ldots, t(L_V)$ according to the formulas $$b(k) = \sum_{j=1}^{k} s(j);$$

$$t(k) = \sum_{j=1}^{k} 2^{k-j} s(j)$$

Since it is normally more economical to store the $L_V$ values $s(1), s(2), \ldots, s(L_V)$ than to store the $2L_V$ values $b(1), b(2), \ldots, b(L_V)$ and $t(1), t(2), \ldots, t(L_V)$, this approach is adopted by the preferred embodiment of the invention shown in FIGS. 1-6.

Detailed Structural Design

Referring again to FIG. 1, we will now describe in detail When the decoding apparatus is not performing a decoding operation, the control circuitry 9 provides a MODE=0 signal on line 31, and the compare/combine circuitry 7 provides a DONE=0 signal on line 19. The MODE=0 signal is supplied via line 31 to the F table 1, the S table 3, the summation circuitry 5, and the compare/combine circuitry 7. The DONE=0 signal is supplied via line 19 to the control circuitry 9, the data source 13, and the data receiver 17.

A decoding operation is initiated by a START signal on line 21 in conjunction with a clock pulse on line 25. The START signal and clock pulse are supplied by the data receiver 17 to the decoding apparatus 10 and the data source 13. Then, successive clock pulses supplied by the data receiver 17 on line 25 cause the data source to provide successive codewords serially over line 11 to the decoding apparatus 10. The successive clock pulses on line 25 also cause the decoding apparatus 10 to decode the codewords supplied thereto on line 11 and to provide the corresponding fixed-length characters on line 15. As will be described, the internal timings of the data source 13 and the decoding apparatus 10 cause exactly one codeword to be transmitted via line 11, and subsequently decoded, in response to each group of $L_V + 1 = 8$ clock pulses.

Following the initializing START signal on line 21 in conjunction with a clock pulse on line 25, the data source 13 supplies the successive bits of successive codewords via line 11 to the decoding apparatus 10. These codeword bits are supplied in response to clock pulses on line 25 in conjunction with a DONE=0 signal provided on line 19 by the decoding apparatus 10. Each successive codeword is supplied serially during a group of $L_V + 1 = 8$ clock pulses. When an entire codeword has been supplied, the decoding apparatus 10 provides a DONE=1 signal on line 19 to delay transmission of the next successive codeword until the beginning of the next group of $L_V + 1 = 8$ clock pulses.

During a decoding operation, the decoding apparatus 10 processes each codeword in response to a group of $L_V + 1 = 8$ successive clock pulses on line 25. The control circuitry 9 provides a MODE=1 signal in conjunction with the first $L_V = 7$ clock pulses and a MODE=0 signal in conjunction with the last clock pulse in each group of $L_V + 1 = 8$ clock pulses. These MODE=1 and MODE=0 signals are supplied via line 31 to the F table 1, the S table 3, the summation circuitry 5, and the compare/combine circuitry 7.

At the beginning of each block of $L_V + 1 = 8$ clock pulses during a decode operation, the S table 3 supplies the stored value $s(1)$ via lines 33 to the summation circuitry 5. Thereafter, $k \geq 1$ successive clock pulses on line 25 in conjunction with a MODE=1 signal on line 31 cause the S table 3 to supply the value $s(k+1)$ on lines 33. These $k \geq 1$ clock pulses also cause the summation circuitry 5 to calculate the values $t(k)$ and $b(k)$, which are supplied via lines 35 and 37, respectively, to the compare/combine circuitry 7. The values $t(k)$ and $b(k)$ are calculated according to the formulas $t(1) = b(1) = s(1);$
$t(k) = 2t(k-1) + s(k),$ for $k > 1;$
$b(k) = b(k-1) + s(k),$ for $k > 1.$ At the beginning of each group of $L_V + 1 = 8$ clock pulses during a decode operation, the compare/combine circuitry 7 supplies the signal DONE=0 via line 19 to the data source 13. Thereafter, $k \geq 1$ successive clock pulses on line 25 cause the data source 13 to provide the successive bits $Y_1, Y_1, \ldots, Y_k$ of a codeword $c_V(i)$ to be decoded. These codeword bits are supplied via line 11 to the compare/combine circuit 7. The compare/combine circuit concatenates the codeword bits received to form an integer $y(k) = y_1y_2 \ldots y_k$, and this integer is compared with the value $t(k)$ supplied via lines 35. If $y(k) > t(k)$, then $y(k)$ is known to be the first $k$ bits of a codeword whose length exceeds $k$ bits. Alternatively, if $y(k) > t(k)$, then $y(k) = c_y(i)$, the codeword to be decoded. The index $i$ of this codeword is calculated according to the formula $$i = y(k) - t(k) + b(k)$$

and supplied via lines 39 to the F table 1. A DONE-1 signal is then provided on line 19 during the remaining clock pulses in the group of $L_V + 1 = 8$ clock pulses devoted to processing the codeword $c_y(i)$ just decoded. This DONE=1 signal is supplied via line 19 to the data source 13, and it serves to delay the transmission of the next successive codeword until the beginning of the next group of $L_V + 1 = 8$ clock pulses.

Since codewords are at most $L_V = 7$ bits long, the first $L_V = 7$ clock pulses in a block of $L_V + 1 = 8$ clock pulses permit any codeword $c_y(i)$ to be input via line 11 and combined with the appropriate values $t(k)$ and $b(k)$ to provide the corresponding index $i$ via lines 39 to the F table 1. The final clock pulse in the block of $L_V + 1 = 8$ clock pulses occurs in conjunction with a MODE=0 signal supplied by the control circuitry 9 via line 31 to the F table 1. As will be described, this final clock pulse on line 25 in conjunction with a MODE=0 signal on line 31 prepares the F table 1 for accessing the fixed-length character $f(i)$ corresponding to the codeword $c_y(i)$. This fixed-length character is accessed in conjunction with the first clock pulse in the group of $L_V + 1 = 8$ clock pulses devoted to processing the next successive codeword. The fixed-length character is then supplied via lines 15 to the data receiver 17.

Figure 2:
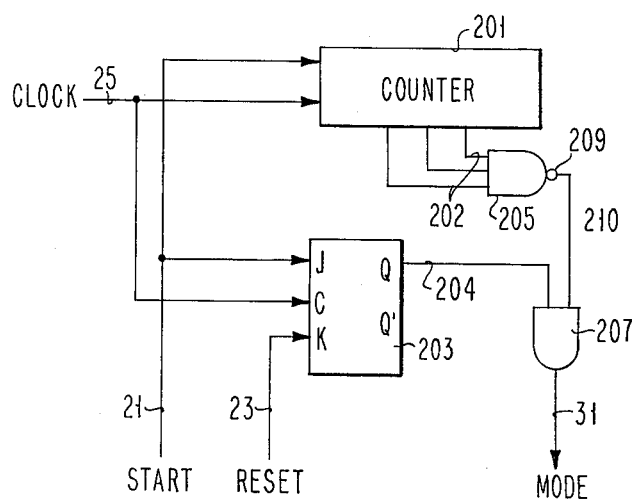
FIG. 2 is a detailed block diagram of the control block 9 of FIG. 1.

Referring now to FIG. 2, there is provided a detailed logical design for the control circuitry 9 seen in FIG. 1. The circuitry comprises a 3-bit counter 201, a JK flip-flop 203, two AND gates 205 and 207, and a single INVERTER gate 209. The inputs to this circuitry comprise the clock pulses on line 25, START signals on line 21, and RESET signals on line 23. The single output is the MODE signal on line 19.

When the decoding apparatus 10 is not performing a decoding operation, the flip-flop 203 is in the reset state. The resulting absence of an output on line 204 from flip-flop 203 serves to block AND gate 207, so that a MODE=0 signal is supplied on line 21.

A START signal on line 21 in conjunction with a clock pulse on line 25 serves to set flip-flop 203. Thereafter, the output on line 204 from flip-flop 203 serves to enable AND gate 207. A START signal on line 21 in conjunction with a clock pulse on line 25 also serves to zero counter 201. Thereafter, successive clock pulses on line 25 in the absence of a START signal cause counter 201 to count modulo 8. That is, the successive outputs on lines 202 from counter 201 are 000, 001, 010, 011, 100, 101, 110, 111, 000, 001, ..., and so on. These outputs are supplied to AND gate 205. AND gate 205 and INVERTER 209 serve to provide a signal on line 210 except when the outputs on lines 202 from counter 201 are 111. Thus AND gate 207, which is enabled by the continuous signal on line 204 from flip-flop 203, serves to provide a MODE=1 signal on line 19 except when the outputs on lines 202 from counter 201 are 111. That is, for each group of $L_V + 1 = 8$ clock pulses, AND gate 207 provides $L_V = 7$ MODE=1 signals followed by a single MODE=0 signal.

Figure 3:
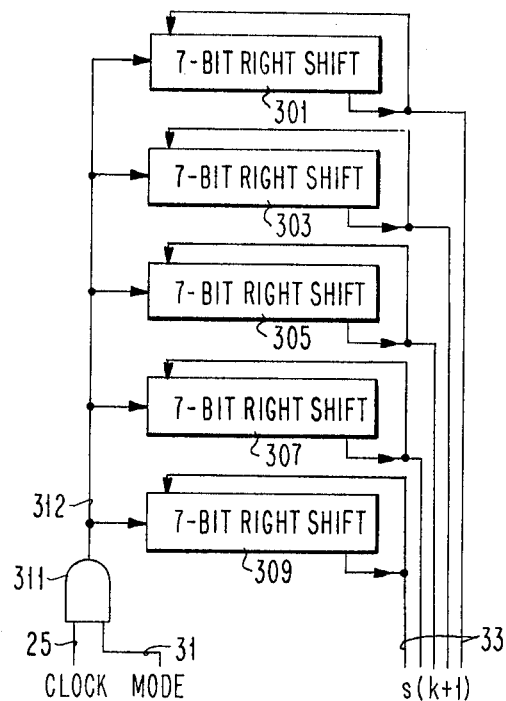
FIG. 3 is a detailed block diagram of the S table block 3 of FIG. 1.

Referring now to FIG. 3, there is provided a detailed logical design for the S table 3 seen in FIG. 1. The circuitry comprises a single AND gate 311 and five 7-bit circular shift registers 301, 303, 305, 307 and 309. The inputs to this circuitry comprise the clock pulses on line 25 and the MODE signals on line 31. The single output is the value $s(k + 1)$ provided on lines 33.

As has been described, the S table stores the $L_V = 7$ binary values $s(1), s(2), \ldots, s(L_V)$, where the $k^{th}$ value $s(k)$ is the number of $k$-bit codewords in the variable-length minimum-redundancy code to be decoded. Each binary value $s(k)$ has its five bits distributed among the five shift registers 301, 303, 305, 307 and 309. When the decoding apparatus 10 is not performing a decoding operation, the binary value $s(1)$ occupies the rightmost positions of the various shift-registers and hence is provided therefrom on lines 33. At this time the remaining binary values $s(2), s(3), \ldots, s(L_V)$ occupy the successive positions of the shift-registers. For example, Table 4 illustrates the arrangement for the binary values $s(1), s(2), \ldots, s(7)$ shown in Table 3.

Table 4.

Distribution of Binary Values s(k)
Among Five 7-bit Shift Registers

| | s(7) | s(6) | s(5) | s(4) | s(3) | s(2) | s(1) |
|---|---|---|---|---|---|---|---|
| Shift-Register 301 | 0 | 1 | 0 | 0 | 0 | 1 | 0 |
| Shift-Register 303 | 1 | 1 | 1 | 1 | 1 | 0 | 0 |
| Shift-Register 305 | 0 | 0 | 0 | 1 | 0 | 0 | 0 |
| Shift-Register 307 | 0 | 0 | 0 | 0 | 0 | 0 | 0 |
| Shift-Register 309 | 0 | 0 | 0 | 0 | 0 | 0 | 0 |

During a decoding operation, each codeword is processed by a group of $L_V + 1 = 8$ clock pulses. As has been described, the control circuit 9 supplies on line 31 the signal MODE=1 with the first seven clock pulses and the signal MODE=0 with the final clock pulse in each group of $L_V + 1 = 8$ clock pulses. At the beginning of each group by $L_V + 1 = 8$ clock pulses, shift registers 301, 303, 305, 307 and 309 supply the value $s(1)$ on lines 33. Thereafter, $k \geq 1$ clock pulses in conjunction with a MODE=1 signal cause the shift-registers to supply the value $s(k + 1)$ on lines 33. This is because each clock pulse on line 25 in conjunction with a MODE=1 signal on line 31 causes AND gate 311 to supply a clock pulse on line 312. This clock pulse on line 312 causes each shift-register to shift to the right by one position, so that the bits of the binary value $s(k + 1)$ are supplied on lines 33 after $k$ clock pulses.

As indicated in FIG. 3, each bit shifted out from the right end of a shift-register is shifted back in at the left end of that same shift-register. Thus, $L_V = 7$ shifts in response to $L_V = 7$ clock pulses with MODE=1 return the shift-registers to their original condition illustrated in Table 4, with $s(1)$ supplied on lines 33. The MODE=0 signal on line 31 that accompanies the final clock pulse in each group of $L_V + 1 = 8$ clock pulses serves to block AND gate 311 so that no shift occurs. Hence the value $s(1)$ is still supplied on lines 33 at the beginning of the next group of $L_V + 1 = 8$ clock pulses.

Figure 4:
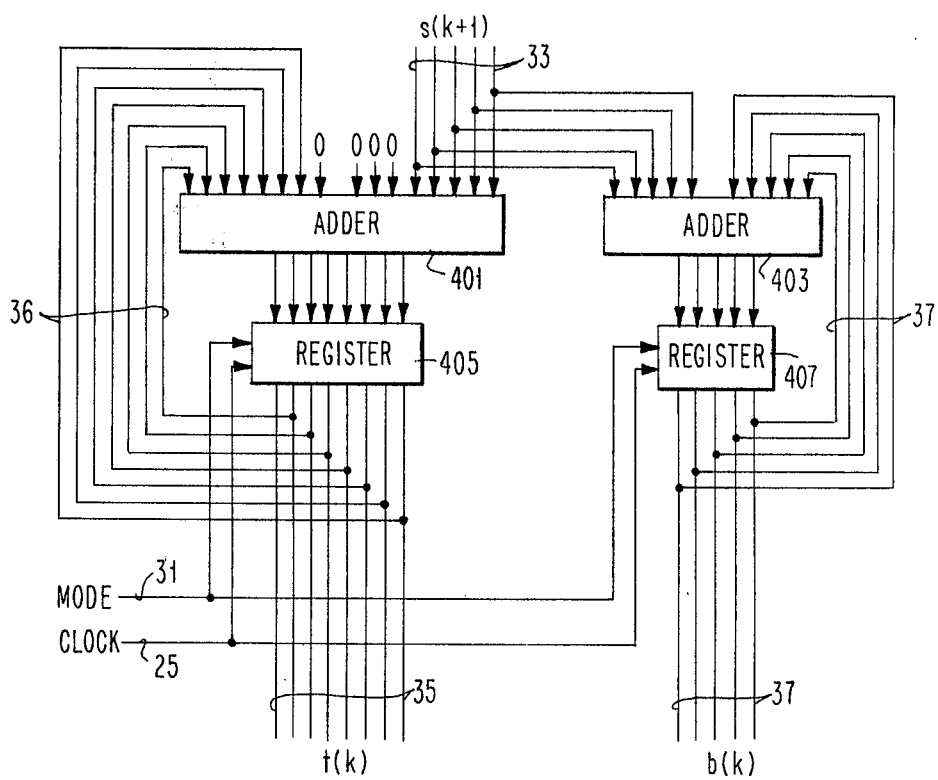
FIG. 4 is a detailed block diagram of the summation circuitry block 5 of FIG. 1.

Referring now to FIG. 4, there is provided a detailed logical design for the summation circuitry 5 seen in FIG. 1. The circuitry comprises an 8-bit adder 401, a 5-bit adder 403, an 8-bit register 405, and a 5-bit register 407. The inputs to this circuitry comprise the clock pulses on line 25, the MODE signals on line 31, and the value $s(k + 1)$ on lines 33. The two outputs are the values $t(k)$ and $b(k)$, which are supplied, respectively on lines 35 and lines 37.

When the decoding apparatus 10 is not performing a decoding operation, the binary value $s(1)$ is supplied on lines 33 by the S table 3. Also, registers 405 and 407 initially supply binary zeros on lines 35, 36, and 37. Hence adders 401 and 403 supply the value $s(1)$ to the inputs of registers 405 and 407.

When a decoding operation begins, the first clock pulse on line 25 in conjunction with a MODE=1 signal on line 31 causes the value $s(1)$ to be loaded into registers 405 and 407. These registers then provide the values $t(1) = s(1)$ and $b(1) = s(1)$ on lines 35 and 37, respectively. As shown in FIG. 4, lines 37 provide the value $b(1) = s(1)$ to one of the inputs for adder 403. Also, lines 36 shift the value $t(1) = s(1)$ to the left by one position and supply the resulting value of $2t(1)$ to one of the inputs for adder 401. Additionally, as has been described, the first clock with MODE=1 causes the S table 3 to provide the value $s(2)$ on lines 33. This value is supplied to one of the inputs for each of adders 401 and 403. Thus, adder 401 supplies the value $t(2) = 2t(1) + s(2)$ to the inputs of register 405, and adder 403 supplies the value $b(2) = b(1) + s(3)$ to the inputs of register 407. A second clock pulse on line 25 in conjunction with a MODE=1 signal on line 31 causes the values $t(2)$ and $b(2)$ to be loaded into registers 405 and 407. These values are thence supplied on lines 35 and 37.

Similarly, the first $k \geq 1$ clock signals in any block of $L_V + 1 = 8$ clock pulses used to decode a codeword cause registers 405 and 407 to accumulate $t(k)$ and $b(k)$, respectively. At this time lines 36 supply the value $2t(k)$ to one input of adder 401, lines 37 supply the value $b(k)$ to one input of adder 403, and S table 3 supplies the value $s(k + 1)$ via lines 33 to one input of each adder. Thus adders 401 and 403 supply the respective values $t(k + 1) = 2t(k) + s(k + 1)$ and $b(k + 1) = b(k) + s(k + 1)$ to the inputs of registers 405 and 407. Hence a subsequent $(k + 1)^{th}$ clock pulse with MODE=1 loads the values $t(k + 1)$ and $b(k + 1)$ into registers 405 and 407. These values are thence supplied on lines 35 and 37.

As has been discussed, the final clock pulse in each group of $L_V + 1$ clock pulses devoted to the processing of a codeword is accompanied by a MODE=0 signal. As indicated in FIG. 4, this clock pulse on line 25 in conjunction with a MODE=0 signal on line 31 zeros registers 405 and 407. These registers are thus prepared for the loading of the values $t(1) = s(1)$ and $b(1) = s(1)$ with the first clock pulse in the next group of $L_V + 1 = 8$ clock pulses.

Figure 5:
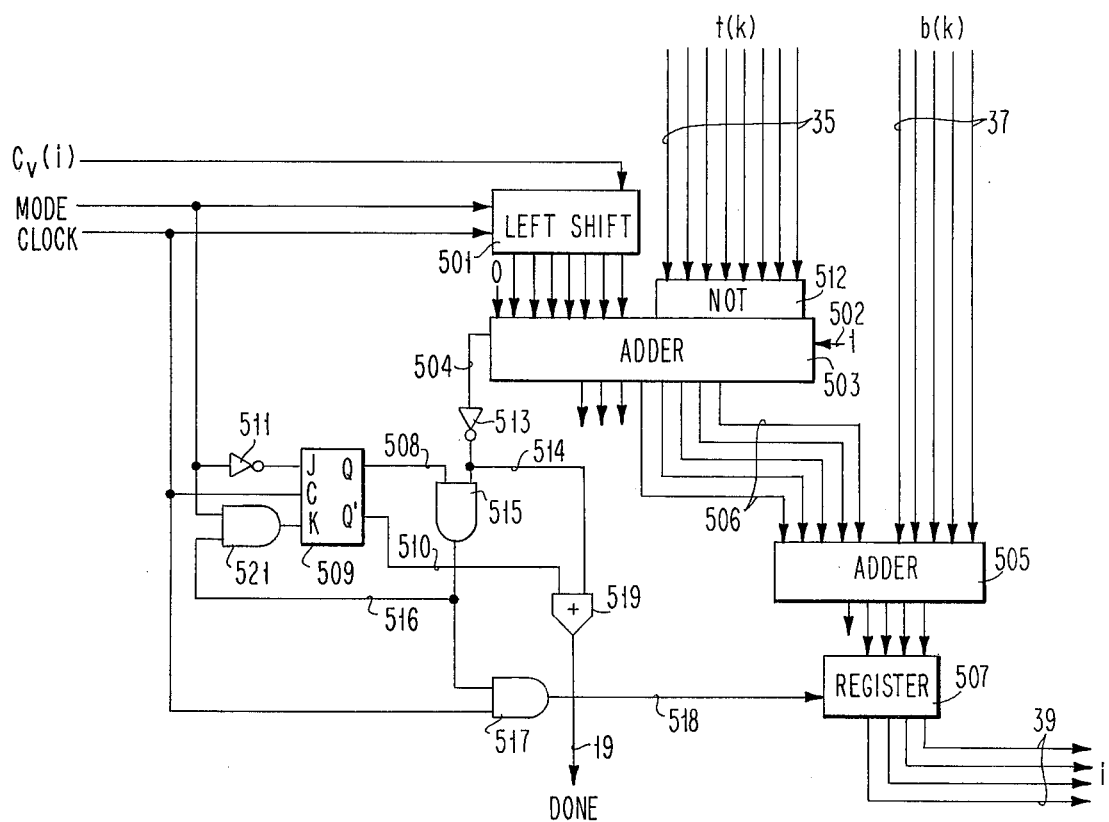
FIG. 5 is a detailed block diagram of the compare/combine circuitry block 7 of FIG. 1.

Referring now to FIG. 5, there is provided a detailed logical design for the compare/combine circuitry 7 seen in FIG. 1. The circuitry comprises a shift-register 501, two adders 503 and 505, a register 507, a JK flip-flop 509, INTERTER gates 511, 512 and 513, three AND gates 515, 517, and 521, and an OR gate 519. The inputs to this circuitry comprise the clock pulses on line 25, the MODE signals on line 31, the values $t(k)$ and $b(k)$ on lines 35 and 37, and the successive bits of a codeword $c_V(i)$ on line 11. The outputs are the DONE signal on line 19 and the integer $i$ on lines 39.

When the decoding apparatus 10 is not performing a decoding operation, the JK flip-flop 509 is in the set state and the shift-register 501 supplies a binary zero to one input of adder 503. As has been described, the summation circuitry supplies a binary zero on lines 35 to INVERTERS 512. Thus the INVERTERS 512 supply the binary value 11111111 to the second input of adder 503. Since the carry input 502 to adder 503 is permanently supplied a binary one, the addition of this one and the binary value 11111111 generates a carry output on line 504. This output signal is inverted by INVERTER 513, so that no signal is provided on line 514 to OR gate 519. Since the flip-flop 509 is in the set condition, no signal is supplied therefrom on line 510 to OR gate 519. Hence, when the decoding apparatus 10 is not performing a decoding operation, OR gate 519 supplies a DONE=0 signal on line 19.

During a decoding operation, successive clock pulses on line 25 in conjunction with a DONE=0 signal on line 19 cause the successive bits $y_1, y_2, \ldots$ of a codeword $c_V(i)$ to be shifted into shift-register 501. After $k \geq 1$ such clock pulses, shift-register 501 contains the integer $y(k)$ and supplies this value to one input of adder 503. As has been described, these $k \geq 1$ clock pulses also cause summation circuitry 5 to supply the binary value $t(k)$ via lines 35 to INVERTERS 512. Adder 503 and INVERTERS 512 serve to subtract $s(k)$ from $y(k)$ according to the well-known formula for binary arithmetic, $y(k) - t(k) = y(k) + \overline{t(k)} + 1$. If the resuting difference is nonnegative, i.e., if $y(k) \geq t(k)$, then a carry output is generated by adder 503 on line 504. This output signal is inverted by INVERTER 513, and the consequent absence of a signal on line 514 serves to block AND gate 515. Also, since the flip-flop 509 is in the set condition, the absence of signals on lines 514 and 510 serve to block OR gate 519. Thus, if $y(k) \geq t(k)$, OR gate 519 supplies a DONE=0 signal on line 19.

On the other hand, if $y(k) < t(k)$, then no carry output is generated by adder 503. In this case INVERTER 513 provides an enabling signal on line 514 to AND gate 515 and OR gate 519. OR gate 519 thus supplies an immediate DONE=1 signal on line 19 to indicate that a complete codeword has been received. Also, since flip-flop 509 is in the set condition, the output therefrom on line 508 and the signal on line 514 are used by AND gate 515 to provide an enabling signal on line 516. This signal serves to enable AND gate 517 and 521. Thus, if the next clock pulse is accompanied by a MODE=1 signal, AND gate 521 causes this clock pulse to reset flip-flop 509. In any case, this next clock pulse is transmitted by AND gate 517 and via line 518 to register 507, which is thus loaded with the output supplied thereto from adder 505. The inputs to adder 505 are the quantity $y(k) - t(k)$ provided on lines 506 from adder 503 and the value $b(k)$ supplied on lines 37 by summation circuitry 5. Hence the clock pulse on line 518 loads the value $i = y(k) - t(k) + b(k)$ into register 507. This value is then supplied therefrom on lines 39 to the F table 1.

As has been described, if the condition $y(k) < t(k)$ signalling the reception of a complete codeword occurs before the final clock pulse in the group of $L_V + 1 = 8$ clock pulses devoted to processing the codeword, then the accompanying MODE=1 signal causes flip-flop 509 to be reset. The output therefrom on line 510 to OR gate 519 ensures a continuing DONE=1 signal on line 19. Also, the absence of an output on line 508 serves to block AND gate 515 and 517. Thus the codeword index $i$ loaded into register 507 is undisturbed during the remaining clock pulses in the group of $L_V + 1 = 8$ clock pulses devoted to the processing of the codeword already received.

The final clock pulse in the group of $L_V + 1 = 8$ clock pulses is accompanied by a MODE=0 signal on line 31. This clock pulse and MODE=0 signal serve to zero shift-register 501. Also, the MODE=0 signal to block AND gate 521 and is inverted by INVERTER 511 to provide an enabling signal to the set input of flip-flop 509. Thus the clock pulse with the MODE=0 signal also sets flip-flop 509, so that the compare/combine circuitry is prepared for decoding the next codeword to be transmitted.

Figure 6:
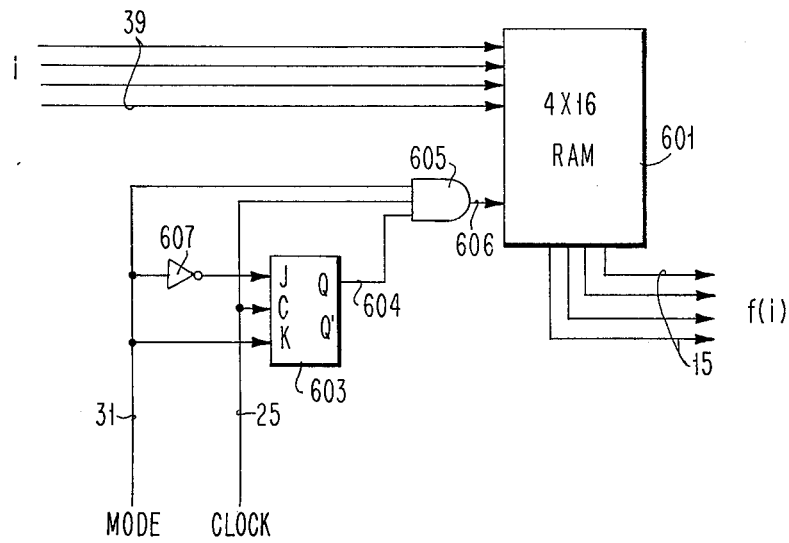
FIG. 6 is a detailed block diagram of the F table block 1 of FIG. 1.

Referring now to FIG. 6, there is provided a detailed logical design for the F table 1 seen in FIG. 1. The circuitry includes a 4 × 16 RAM 601, a JK flip-flop 603, an AND gate 605, and an INVERTER 607. The inputs to the circuitry comprise the MODE signals on line 31, the clock puses on line 25, and the codeword index $i$ on lines 39. The single output is the fixed-length character $f(i)$, which is supplied on lines 15.

As has been described, each codeword is decoded by a group of $L_V = 7$ clock pulses with MODE=1 followed by a single clock pulse with MODE=0. The MODE=1 signals on line 31 enable the reset input of flip-flop 603, so that the clock pulses with MODE=1 serve to reset the flip-flop. The resulting absence of an output therefrom on line 604 serves to block AND gate 605. The MODE=0 signal accompanying the final clock pulse in each group of $L_V + 1 = 8$ clock pulses is inverted by INVERTER 607 to provide an enabling signal to the set input of flip-flop 603. Thus the final clock pulse in each group of $L_V + 1 = 8$ clock pulses sets the flip-flop. The resulting output on line 604 provides an enabling input to AND gate 605.

At the end of the group of $L_V + 1 = 8$ clock pulses devoted to the decoding of a codeword $c_V(i)$, the codeword index $i$ is supplied on lines 39 by the compare/combine circuitry 7, as has been described. Also, the output on line 604 from flip-flop 603 provides an enabling input to AND gate 605. Thus, the first clock pulse in the group of $L_V + 1 = 8$ clock pulses devoted to processing the next codeword, and the MODE=1 signal accompanying this clock pulse, are used by AND gate 605 to provide a READ signal on line 606 to RAM 601. This causes the RAM to access the fixed-length character $f(i)$, which is supplied therefrom on lines 15.

This completes the description of the preferred embodiment of the invention shown in FIGS. 1-6.

In summary, an apparatus has been described for decoding codewords of a variable-length minimum-redundancy code into the corresponding fixed-length characters of a data base. Furthermore, an appropriate adjustment of its stored table values will enable the apparatus described to implement a variety of variable-length minimum-redundancy codes for a variety of different data bases.

While the invention has been particularly shown and described with reference to the preferred embodiment thereof, it will be understood by those skilled in the art that various changes in form and details may be made therein without departing from the spirit and scope of the invention.

What is claimed is:

1. Apparatus for converting the code words of variable length codes into corresponding fixed-length characters, comprising:
   a table storage for storing two tables, a first table containing the fixed-length characters, and a second table whose values $s(1), s(2), \ldots$ uniquely identify the variable length code;
   summation circuitry including means operative as the successive code word bits are received to calculate from elements of the second table successive values of a weighted sum $t(1), t(2), \ldots$ and an unweighted sum $b(1), b(2), \ldots$ according to the relation:

$$t(k) = \sum_{j=1}^{k} 2^{k-j} s(j),$$

$$b(k) = \sum_{j=1}^{k} s(j);$$

compare/combine circuitry adapted to accept as input the successive bits of a code word to be converted into its corresponding fixed character, connected to said summation circuitry, responsive to the successive values of said weighted sum to isolate the bits comprising the code word;
   said compare/combine circuitry further including means for adding said code word to the unweighted sum and subtracting the weighted sum to provide a fixed-length integer; and
   means responsive to said integer to index said table of fixed-length characters.

2. Apparatus for converting the code words of variable-length codes into corresponding fixed-length characters, comprising:
   a table storage for storing a first table containing the fixed-length characters and a second table whose contents $s(1), s(2), \ldots$ uniquely identify the variable-length code;
   compare/combine circuitry connected to receive successive bits of a code word to be converted into a corresponding fixed-length character;
   summation circuitry connected to said table storage, adapted to respond as said successive code word bits are received to operate on stored elements of said second table to calculate successive values of a weighted sum $t(1), t(2), \ldots$ and an unweighted sum $b(1), b(2), \ldots$ according to the relation:

$$t(k) = \sum_{j=1}^{k} 2^{k-j} s(j),$$

$$b(k) = \sum_{j=1}^{k} s(j);$$

means connecting said summation circuitry to said compare/combine circuitry;
   means in said compare/combine circuitry responsive to said weighted sum to isolate bits comprising said code word; and
   means in said compare/combine circuitry connected to said table storage for adding said code word to said unweighted sum nd subtracting the weighted sum to provide a fixed-length integer for use in indexing said first table.

3. Apparatus for converting the code words of a variable-length code $C_V$ into corresponding fixed-length characters $C_F$, comprising:
   a table storage for storing a first table containing the fixed-length characters and a second table whose contents $s(1), s(2), \ldots$ uniquely identify the variable-length code;
   compare/combine circuitry connected to receive successive bits $y_1, Y_2, \ldots$ of a codeword $C_V(i)$ to be converted into a corresponding fixed-length character;
   summation circuitry connected to said table storage adapted to respond as said successive code word bits are received to operate on stored elements of said second table to calculate successive values of weighted sums $t(1)$, $t(2)$ . . . and unweighted sum $b(1)$, $b(2)$, . . . according to the relations:

$$t(k) = \sum_{j=1}^{k} 2^{k-j} s(j),$$

$$b(k) = \sum_{j=1}^{k} s(j);$$

means connecting said summation circuitry to said compare/combine circuitry;

means in said compare/combine circuitry responsive to said weighted sum to isolate bits comprising said code word by comparing the successive codeword bits $Y_1, Y_2, \ldots$ with successive values of the weighted sum $t(1), t(2), \ldots$ until a value $t(k)$ is found to exceed the corresponding $k$-bit integer $$y(k) = Y_1 Y_2 Y_3 \ldots Y_k$$

comprising $k$ accumulated codeword bits; and means in said compare/combine circuitry connected to said table storage for combining said weighted sum and said unweighted sum with said isolated code word to calculate a fixed-length integer $i = \lambda$ $y(k) - t(k) + b(k)$ for use in indexing said first table.

4. The combination according to claim 3 wherein the length $L_V(i)$ of the codeword $C_V(i)$ representing the ith most frequently occurring fixed-length character is equal to the length of the Huffman codeword for this character, and wherein the codeword $C_V(i)$ is the $L_V(i)$-bit binary integer with value $$\sum_{j=0}^{i-1} 2^{L_V(i) - L_V(j)}.$$

5. The combination according to claim 3 wherein the $k$th tabular value $s(k)$ is the number of $k$-bit codewords in the variable-length minimum-redundancy code $C_V$.

6. The combination according to claim 5 wherein the $k$th tabular value $s(k)$ is the number of $k$-bit codewords in the variable-length minimum-redundancy code $C_V$.

7. The combination according to claim 3 wherein the weighted sums $t(1), t(2), \ldots$ and the unweighted sums $b(1), b(2), \ldots$ are calculated according to the formulas $$t(1) = b(1) = s(1)$$
$$t(k) = 2t(k-1) + s(k), \text{ for } k > 1$$
$$b(k) = b(k-1) + s(k), \text{ for } k > 1$$

8. The combination according to claim 4 wherein the weighted sums $t(1), t(2), \ldots$ and the unweighted sums $b(1), b(2), \ldots$ are calculated according to the formulas $$t(1) = b(1)$$
$$t(k) = 2t(k-1) = s(k), \text{ for } k > 1$$
$$b(k) = b(k-1) + s(k), \text{ for } k > 1$$

9. The combination according to claim 5 wherein the weighted sums $t(1), t(2), \ldots$ and the unweighted sums $b(1), b(2), \ldots$ are calculated according to the formulas $$t(1) = b(1) = s(1)$$
$$t(k) = 2t(k-1) + s(k), \text{ for } k > 1$$
$$b(k) = b(k-1) + s(k), \text{ for } k > 1$$

10. The combination according to claim 3 wherein the ith tabular value $f(i)$ is the ith most frequently occurring fixed-length character.

11. The combination according to claim 4 wherein the ith tabular value $f(i)$ is the ith most frequently occurring fixed-length character.

12. The combination according to claim 5 wherein the ith tabular value $f(i)$ is the ith most frequently occurring fixed-length character.

13. The combination according to claim 6 wherein the ith tabular value $f(i)$ is the ith most frequently occurring fixed-length character.

* * * * *

UNITED STATES PATENT OFFICE
CERTIFICATE OF CORRECTION

Patent No. 4,044,347  Dated August 23, 1977

Inventor(s) David Curtis Van Voorhis

It is certified that error appears in the above-identified patent and that said Letters Patent are hereby corrected as shown below:

Col. 5, line 14, "$P(C_F(i)$" should read --$P(C_F(i))$--;

Col. 6, line 55, "$y_1y_2...$" should read --$y_1y_2, ...$--;

Col. 6, line 59, "$y(k) = Y_1Y_2...Y_k.$" should read --$y(k) = y_1y_2...y_k$--;

Col. 6, line 62, "$Y(k) \geq t(k),$" should read --$y(k) \geq t(k),$--;

Col. 6, line 63 "$Y(k)$" should read --$y(k)$--;

Col. 6, line 68 "$Y(k)$" should read --$y(k)$--;

Col. 7, line 1, "$i = Y(k) - t(k) +$" should read --$i = y(k) - t(k) +$--;

UNITED STATES PATENT OFFICE
CERTIFICATE OF CORRECTION

Patent No. 4,044,347    Dated August 23, 1977

Inventor(s) David Curtis Van Voorhis

It is certified that error appears in the above-identified patent and that said Letters Patent are hereby corrected as shown below:

Col. 7, line 8, "$Y_1 = 1$" should read --$y_1 = 1$--;

Col. 7, line 9, "$Y(1) = Y_1 = 1$" should read --$y(1) = y_1 = 1$--;

Col. 7, line 13, "$y(2) = Y_1Y_2 = 11$" should read --$y(2) = y_1y_2 = 11$--;

Col. 7 line 14, "$Y(2) \geq t(2), Y(2)$" should read --$y(2) \geq t(2), y(2)$--;

Col. 7, line 17, "$Y_1Y_2Y_3 = 111 \geq t(3) = 100$" should read --$y_1y_2y_3 = 111 \geq t(3) = 100$--;

Col. 7, line 18, "$Y(4) = Y_1Y_2Y_3Y_4 = 1110 \geq t(4)=$" should read --$y(4) = y_1y_2y_3y_4 = 1110 \geq t(4)=$--;

Col. 7, line 20, "$Y(5) = Y_1Y_2Y_3Y_4Y_5 = 11100 < 11110, Y(5)$" should read --$y(5) = y_1y_2y_3y_4y_5 = 11100 < 11110, y(5)$--;

UNITED STATES PATENT OFFICE
CERTIFICATE OF CORRECTION

Patent No. 4,044,347  Dated August 23, 1977

Inventor(s) David Curtis Van Voorhis

It is certified that error appears in the above-identified patent and that said Letters Patent are hereby corrected as shown below:

Col. 7, line 23, "$i = Y(5) - t(5) + b(5) = 11100 - 11110 + 1011 =$" should read --$i = y(5) - t(5) + b(5) = 11100 - 11110 + 1011 =$ --;

Col. 7, line 25, "$Y(5) = 11100$" should read --$y(5) = 11100$--;

Col. 8, line 66, "$Y_1, Y_1, \ldots, Y_k$" should read --$y_1, y_1, \ldots, y_k$--;

Col. 14, line 52, "nd" should read --and--;

Col. 14, line 63, "$y_1, Y_2, \ldots$" should read --$y_1, y_2, \ldots$--;

UNITED STATES PATENT OFFICE
CERTIFICATE OF CORRECTION

Patent No. 4,044,347          Dated August 23, 1977

Inventor(s) David Curtis Van Voorhis

It is certified that error appears in the above-identified patent and that said Letters Patent are hereby corrected as shown below:

Col. 15, line 16, "$Y_1, Y_2, \ldots$" should read --$Y_1, Y_2, \ldots$--;

Col. 15, line 20, "$y(k) = Y_1 Y_2 Y_3 \ldots Y_k$" should read --$y(k) = Y_1 Y_2 Y_3 \ldots Y_k$--;

Col. 15, line 26, "$1=\lambda$" should read --$1=$--.

Signed and Sealed this

Twenty-seventh Day of December 1977

[SEAL]

Attest:

RUTH C. MASON      LUTRELLE F. PARKER
*Attesting Officer*      *Acting Commissioner of Patents and Trademarks*